(12) United States Patent
Cyr et al.

(10) Patent No.: US 9,812,987 B2
(45) Date of Patent: Nov. 7, 2017

(54) TOPOLOGY FOR CONTROLLED POWER SWITCH MODULE

(71) Applicant: TM4 Inc., Boucherville (CA)

(72) Inventors: Jean-Marc Cyr, Candiac (CA); Maalainine El Yacoubi, Montreal (CA); Mohammed Amar, Montreal (CA); Pascal Fleury, Sainte-Madeleine (CA)

(73) Assignee: TM4 INC., Boucherville, Quebec (CA)

( * ) Notice: Subject to any disclaimer, the term of this patent is extended or adjusted under 35 U.S.C. 154(b) by 289 days.

(21) Appl. No.: 14/429,200

(22) PCT Filed: Sep. 20, 2013

(86) PCT No.: PCT/CA2013/000805
§ 371 (c)(1),
(2) Date: Mar. 18, 2015

(87) PCT Pub. No.: WO2014/043795
PCT Pub. Date: Mar. 27, 2014

(65) Prior Publication Data
US 2015/0222202 A1 Aug. 6, 2015

Related U.S. Application Data

(60) Provisional application No. 61/704,807, filed on Sep. 24, 2012.

(51) Int. Cl.
*H02M 7/537* (2006.01)
*H03K 17/082* (2006.01)
*H02M 7/00* (2006.01)
*H03K 17/567* (2006.01)

(52) U.S. Cl.
CPC ............ *H02M 7/537* (2013.01); *H02M 7/003* (2013.01); *H03K 17/0828* (2013.01); *H03K 17/567* (2013.01)

(58) Field of Classification Search
CPC ........ H02M 7/007; H02M 7/537; H02M 7/538; H02M 7/5387; Y02B 70/1441; H03K 17/0828; H03K 17/567
USPC .................................................. 363/131, 132
See application file for complete search history.

(56) References Cited

U.S. PATENT DOCUMENTS

| 5,687,072 A * | 11/1997 | Rinehart ............... H01L 24/49 363/132 |
| 2003/0095365 A1 | 5/2003 | Nakatake et al. |
| 2007/0200602 A1 | 8/2007 | Ishikawa et al. |

(Continued)

FOREIGN PATENT DOCUMENTS

| CN | 101 764 583 | 6/2010 |
| CN | 102 684 461 | 9/2012 |
| JP | 2006-352811 | 12/2006 |

*Primary Examiner* — Yemane Mehari
(74) *Attorney, Agent, or Firm* — Fay Kaplun & Marcin, LLP

(57) ABSTRACT

The present topology for controlled power switch module is concerned with a module where the parasitic inductance of the emitter of the top power switch is optimized to allow the injection of a sample of the overvoltage across this parasitic inductance in the gate drive circuit of the top power switch as a feedback to slow down the slope of the falling gate voltage during an overvoltage that is above a predetermined value.

14 Claims, 6 Drawing Sheets

(56) References Cited

U.S. PATENT DOCUMENTS

2012/0235663 A1* 9/2012 Bayerer ............... H02M 1/088
323/311

* cited by examiner

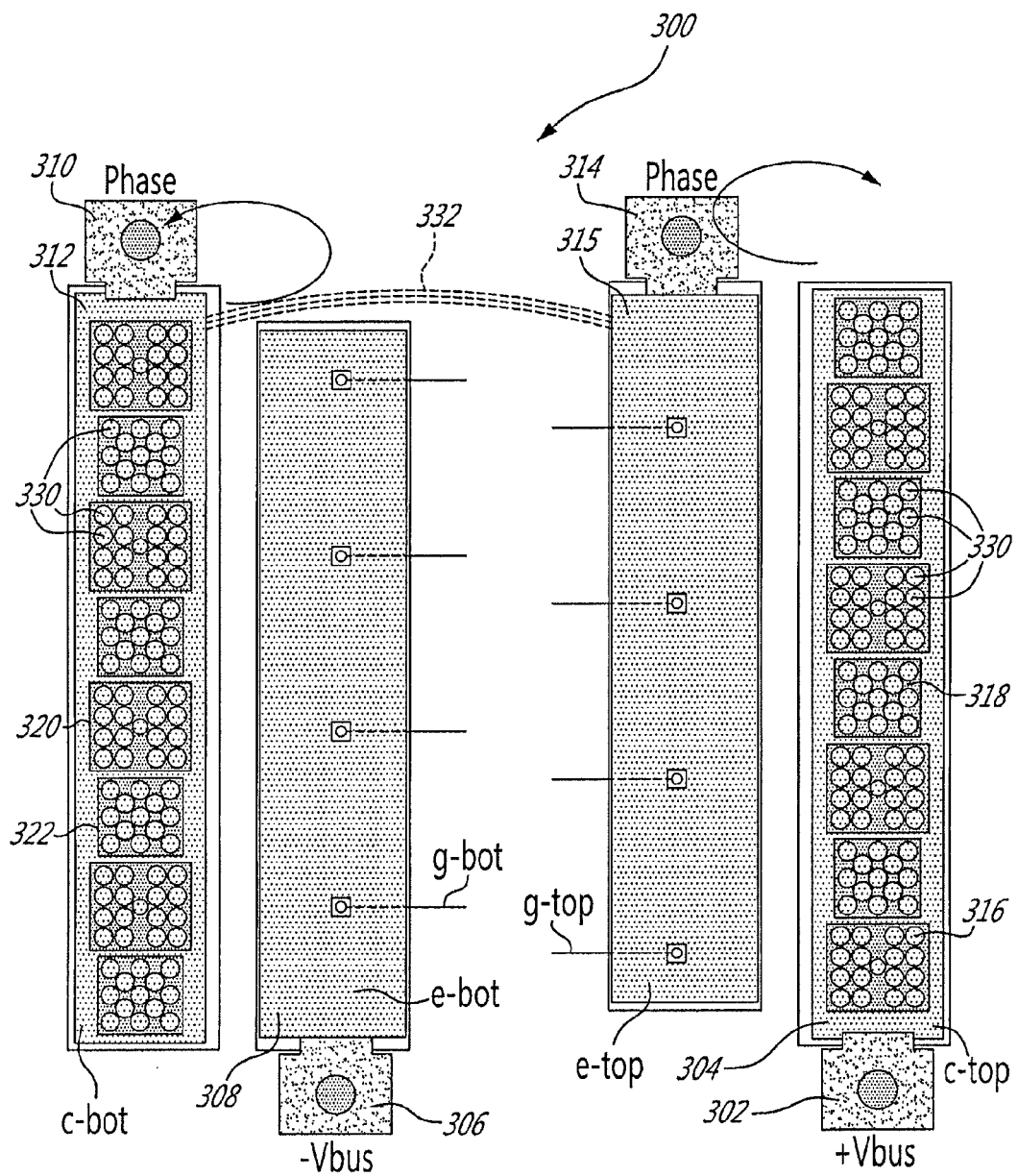

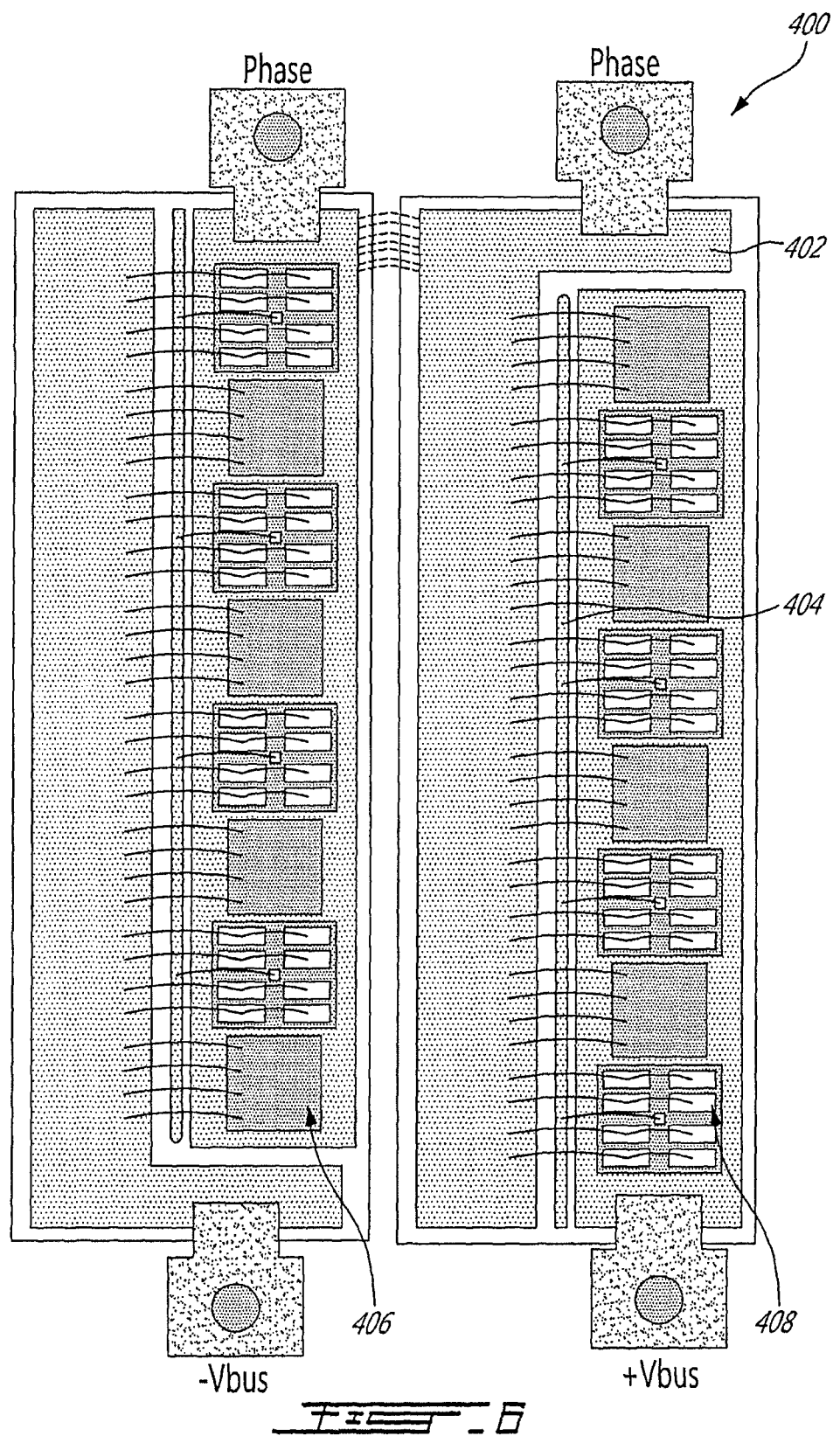

TOPOLOGY FOR CONTROLLED POWER SWITCH MODULE

FIELD

The present invention generally relates controlled power switches. More specifically, the present invention is concerned with a topology for controlled power switch modules.

BACKGROUND

Controlled power switch modules are well known in the art. They are found in the form of, for example, insulated gate bipolar transistors (IGBT), metal-oxide-semiconductor field-effect transistor (MOSFET) and bi-polar transistors.

Controlled power switch modules are usually provided with two input tab connections designed to be connected to a DC (direct current) source and at least one output tab connection designed to provide an AC (alternating current) output. One or more modules are conventionally used, for example, in DC to AC converters.

Each module is provided with one, two or more controlled power switches, one, two or more diodes and possibly other passive components such as resistors and diodes.

Furthermore, with the limited space allowed for the power inverter circuits in electric and/or electric hybrid automotive applications and the high cost of the semiconductors, the demand for integration of power electronics increases.

A known way of reducing the space occupied by the semiconductors in vehicles inverters is to increase their efficiency to allow the size of the cooling surface to be reduced.

The losses in controlled power switch modules present in conventional inverter designs are mainly caused by two sources; conduction losses and switching losses. One way to improve controlled power switch module switching losses is generally by accelerating the controlled power switch turn-on and turn-off. However, with faster controlled power switch turn-off, the overvoltage due to the parasitic inductance of the high-frequency loop increases so much that slow down of the turn-off is often required to protect the device, thereby seriously impacting the efficiency of the inverter.

The power that can deliver the converter is related to the maximum operating voltage and the maximum output current. Limiting the overvoltage across the controlled power switch allows the operation at a higher voltage and then provides higher power.

BRIEF DESCRIPTION OF THE DRAWINGS

In the appended drawings:

FIG. 5 illustrates a topology for an IGBT module according to a second illustrative embodiment; and FIG. 6 illustrates a topology for an IGBT module according to a third illustrative embodiment.

DETAILED DESCRIPTION

Figure 1:
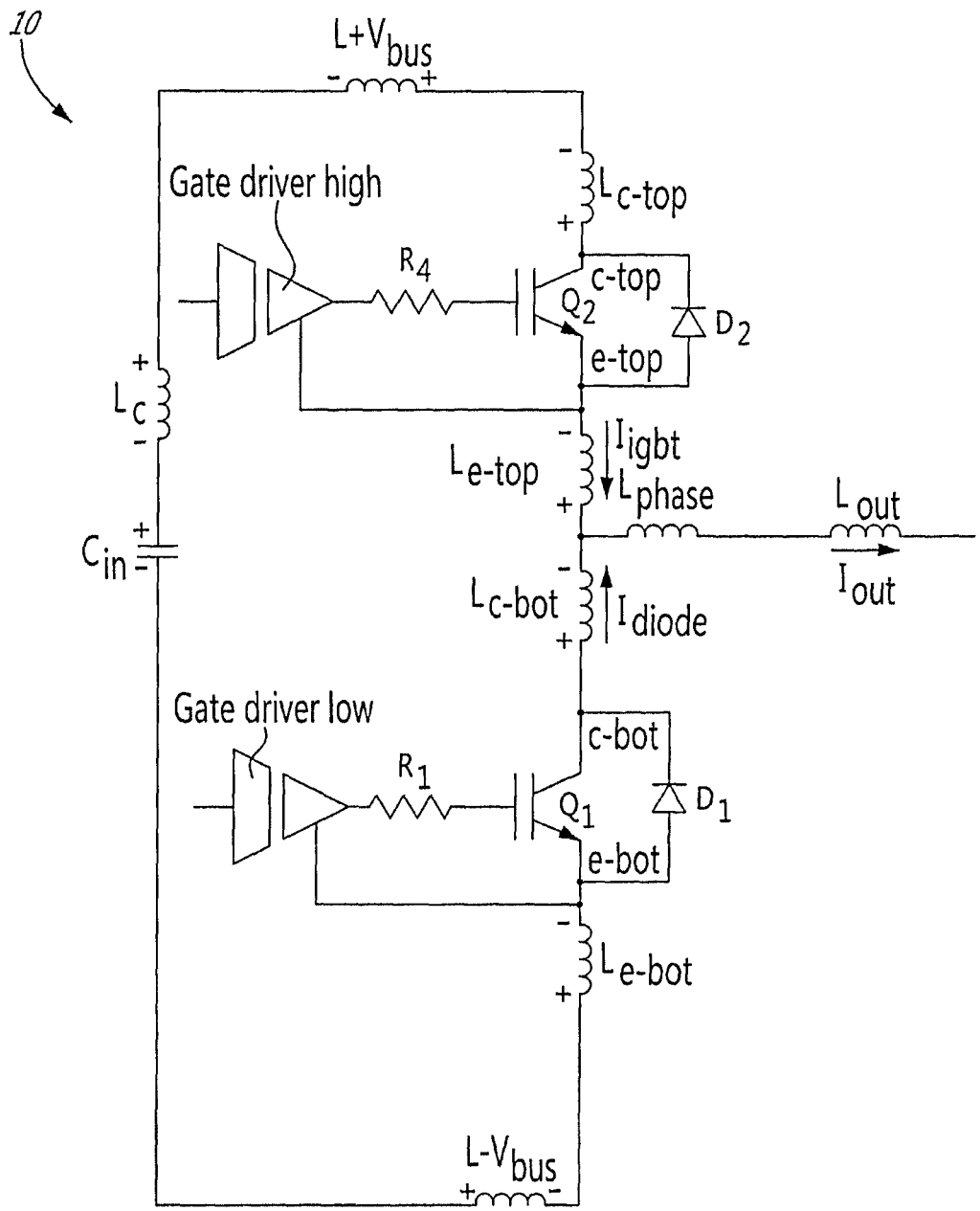
FIG. 1, which is labeled "Prior Art", is a circuit diagram of a typical gate drive IGBT configuration with the high frequency loop, illustrating the parasitic inductances and the logical connection where the gate drivers take their reference.

The use of the word "a" or "an" when used in conjunction with the term "comprising" in the claims and/or the specification may mean "one", but it is also consistent with the meaning of "one or more", "at least one", and "one or more than one". Similarly, the word "another" may mean at least a second or more.

As used in this specification and claim(s), the words "comprising" (and any form of comprising, such as "comprise" and "comprises"), "having" (and any form of having, such as "have" and "has"), "including" (and any form of including, such as "include" and "includes") or "containing" (and any form of containing, such as "contain" and "contains"), are inclusive or open-ended and do not exclude additional, unrecited elements or process steps.

In the present specification and in the appended claims, various terminology which is directional, geometrical and/or spatial in nature such as "longitudinal", "horizontal", "front", rear", "upwardly", "downwardly", etc. is used. It is to be understood that such terminology is used for ease of description and in a relative sense only and is not to be taken in any way as a limitation upon the scope of the present disclosure.

In the present specification and in the appended claims, the same terminology will be used for the interconnections of the controlled power switch. More specifically, the terminology of the IGBT will be used. As will easily be understood by one skilled in the art, the collector of the IGBT has the same function as the drain of the MOSFET and the collector of the bi-polar; the emitter of the IGBT has the same function as the source of the MOSFET and the emitter of the bi-polar; and the gate of the IGBT has the same function as the gate of the MOSFET and the base of the bi-polar. For concision and simplicity purpose, the IGBT will be given as example herein. However, this is not to limit the scope of the present disclosure. Accordingly, the expression IGBT is to be construed, in the present disclosure and in the appended claims as any controlled power switch, including, amongst others, IGBT, MOSFETs and bi-polar transistors.

Similarly, while a controlled power switch module is described and illustrated herein, the present topology also applies to dies and packages. Accordingly, the expression "module" is to be construed herein and in the appended claims as a module, a die or a package.

Other objects, advantages and features of the topology for an controlled power switch module will become more apparent upon reading of the following non-restrictive description of illustrative embodiments thereof, given by way of example only with reference to the accompanying drawings.

In accordance with an illustrative embodiment, there is provided a topology for a controlled power switch module so configured as to be controlled by top and bottom gate driver circuits, the controlled power switch module comprising:

a top controlled power switch including a gate, a collector and an emitter;

a bottom controlled power switch including a gate, a collector and an emitter;

a top collector trace connected to the collector of the top controlled power switch;

a bottom collector trace connected to the collector of the bottom controlled power switch;

a top emitter trace connected to the emitter of the top controlled power switch;

a bottom emitter trace connected to the emitter of the bottom controlled power switch;

a −Vbus tab connected to the bottom emitter trace;

a +Vbus tab connecter to the top collector trace;

at least one phase tab connected to either the bottom collector trace and the top emitter trace;

wherein an interconnection of the top emitter trace to the bottom collector trace defines a parasitic emitter inductance having such a value that the voltage generated thereacross, during dI/dt, is injected in the top gate driver circuit to create a positive voltage at the emitter of the top IGBT to slow down the slope of the gate-emitter voltage (Vge) at turn on.

Generally stated, the present topology for controlled power switch module (hereinafter referred to as an IGBT module) is concerned with an IGBT module where the emitter of the top IGBT is not directly connected to the collector of the bottom IGBT but where these two elements are connected, via traces on a DBC (Direct Bound Copper) to external tabs defining two phase connection tabs that may be interconnected either internally or externally. This indirect connection of the emitter of the top IGBT to the collector of the bottom IGBT allows for a repositioning of the IGBTs on the DBC in the IGBT module to thereby allow the parasitic inductances to be optimized, configured and/or predetermined.

The present topology for IGBT module is also generally concerned with an IGBT module where the parasitic inductance of the emitter of the top IGBT is optimized to allow the injection of a sample of the overvoltage across this parasitic inductance in the gate drive circuit of the top IGBT as a feedback to slow down the slope of the falling gate voltage during an overvoltage that is above a predetermined value.

As is well known to those skilled in the art, the dI/dt at turn-off of the IGBT generates a voltage across the parasitic inductance of the high frequency loop that is applied across the IGBT above the bus voltage. Proposed herein is a solution based on the injection of a sample of the overvoltage across the IGBT in the gate drive circuit as a feedback to slow down the slope of the falling gate voltage during the overvoltage above a predetermined value to limit the overvoltage value at this predetermined value.

As is known to those skilled in the art, the commutation process incorporate two major steps: the dI/dt and the dV/dt. The dI/dt is related to the rate of change of the current in the semiconductor and the dV/dt is related to the rate of change of the voltage across the semiconductor. The dI/dt in the controlled power switch occurs first at turn-ON and then the dV/dt occurs once the current is completely transferred from the diode to the controlled power switch. At the end of the turn-ON process, the current is completely transferred from the diodes to the controlled power switch and the voltage from the controlled power switch to the diode. The dV/dt across the controlled power switch occurs first at turn-OFF and then the dI/dt occurs once the voltage is completely transferred across the controlled power switch. At the end of the turn-OFF process, the voltage is transferred from the diodes to the controlled power switch and the current from the controlled power switch to the diode. The dI/dt in the controlled power switch has a positive slope at turn-ON and a negative slope at turn-OFF. The dV/dt has a positive slope across the controlled power switch at turn-OFF and a negative slope at turn-ON.

The bus voltage, across the input capacitor, is applied across the diode when the controlled power switch is ON and across the controlled power switch when it is OFF. The dI/dt is applied on the whole high frequency loop, including the controlled power switch, the diode and the input capacitor.

FIG. 1, which is labeled prior art, discloses one leg of a three-phase power converter 10 used, for example, in the powering of a three-phase electric motor (not shown) from a battery (also not shown).

Since this kind of converter is believed well known to those skilled in the art it will not be described in details herein. It is however to be noted that the inductances, inherently provided in the wires, connections, decoupling capacitor and laminated bus bars, have been schematically represented in FIG. 1.

As can be seen from FIG. 1, the reference of each gate driver is connected to the emitter, typically known as the logical pin, of a corresponding IGBT. For concision purpose, we will describe the bottom portion including the IGBT $Q_1$.

When the IGBT $Q_1$ is turned off, it must be able to withstand the overvoltage created by the dI/dt across the various parasitic inductances ($L_c$, $L_{+bus}$, $L_{c-top}$, $L_{e-top}$, $L_{c-bot}$, $L_{e-bot}$ and $L_{-bus}$) that are present in the circuit. Indeed, since the inductances resist change of current therein, additive voltages develop in the circuit as can be seen by the polarity of the parasitic inductances illustrated in FIG. 1. These voltages added to the source voltage often result in a voltage that is greater than the usual maximal voltage that may safely be applied between the collector and the emitter ($V_{ce}$) of the IGBT.

Generally stated, by changing the reference of the gate driver from the logical pin of FIG. 1 to the ground bus (for the bottom IGBT $Q_1$) and to the collector of the bottom IGBT (for the top IGBT $Q_2$), it is possible to decrease this overvoltage of $V_{ce}$ during turn-off.

In other words, a technique for connecting reference of the gate driver to the power tab of the IGBT instead of to the logical pin has been developed. The voltage across the emitter inductance is thus injected in the gate driver to create a negative voltage (feedback) at the emitter of the IGBT to slow down the negative slope of the gate-emitter voltage ($V_{ge}$). The result is a direct action on the gate voltage without any delay nor additional gate current.

Because there is no optimal emitter inductance between the logical and power connections of the emitter in a conventional commercial IGBT module, a technique has been developed to optimize the sample of the overvoltage injected in the gate drive circuit using a resistive divider. Of course, one skilled in the art will understand that other techniques could be used to adjust the size of the sample of the overvoltage injected. For example, a transformer could be used.

Figure 2:
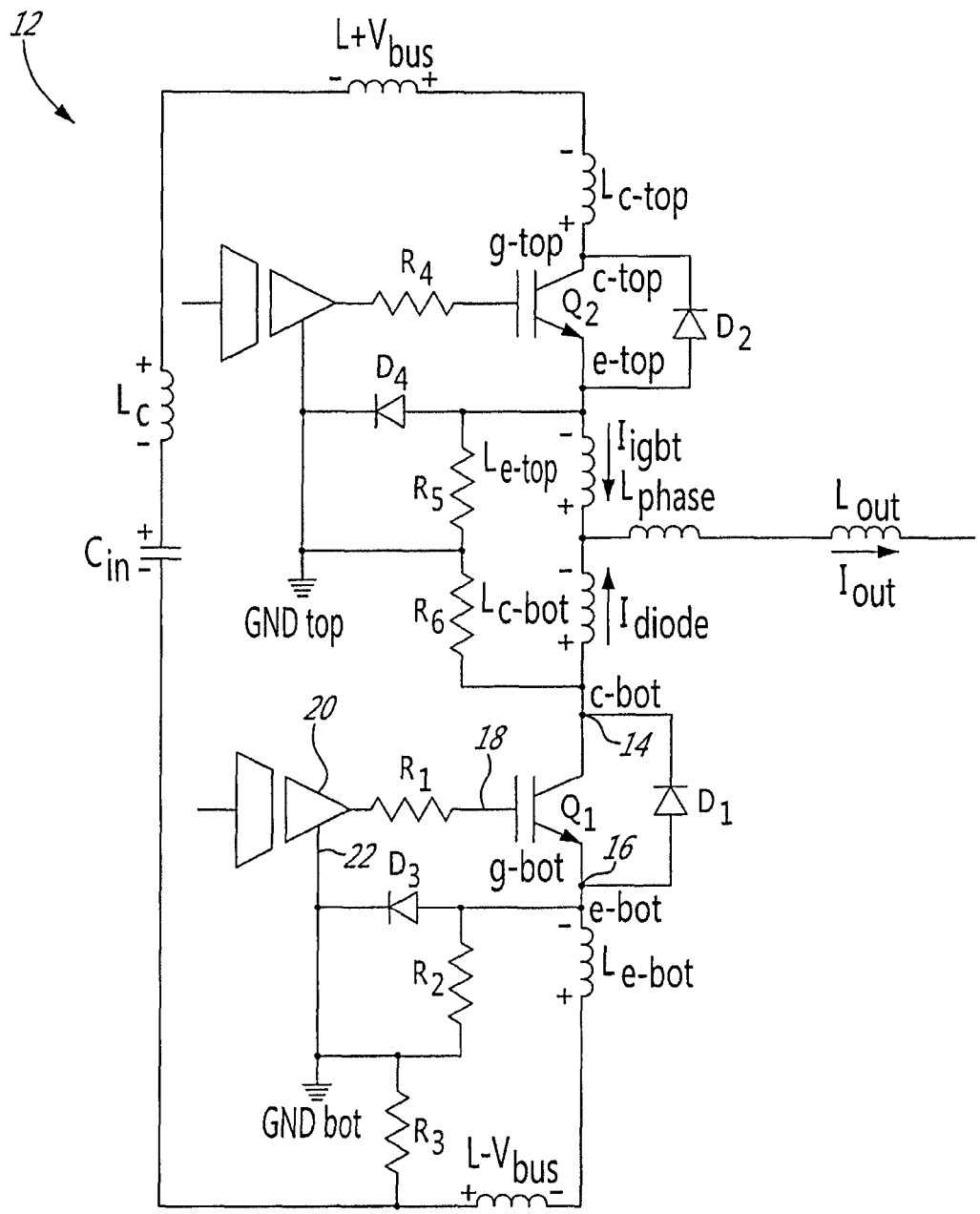
FIG. 2 is a circuit diagram of a gate drive IGBT reducing the overvoltage using a resistive divider connected across the emitter parasitic inductance.

FIG. 2 shows an optimization of the overvoltage with a resistive divider technique.

Again, discussing the bottom portion of one arm of the three-phase power converter 12 of FIG. 2, the IGBT $Q_1$ includes a collector 14 (C-bot) having a parasitic inductance $L_{c-bot}$, an emitter 16 (E-bot) having a parasitic inductance $L_{e-bot}$ and a gate 18 connected to the gate driver 20 via a resistor $R_1$. The reference 22 of the gate driver 20 is connected to a resistive divider circuit including two resistors $R_2$ and $R_3$ and a diode $D_3$ that prevents the turn-on from being impacted.

The values of the resistors $R_2$ and $R_3$ are selected according to the level of overvoltage allowed across $Q_1$. The ratio of $R_2$ over $R_3$ increases to reduce the overvoltage. The value of the two resistor in parallel is set, in series with $R_1$, as the gate driver resistor. This value of the gate resistor is adjusted according to the proper commutation behavior.

By setting the resistor values correctly, it is possible to adjust the effect of the overall parasitic inductance to get the maximum overvoltage allowed to therefore get the best possible performance of the module.

Indeed, since the overvoltage is adjusted by the feedback resistors $R_2$ and $R_3$, it is possible to operate the module at a higher DC voltage using the same current. This allows the module to commutate faster, and/or lower the operating temperature, and/or increase the current, an/or increase the operating voltage.

In other words, the normal practice consisting in using a resistor in the ground connection of the gate drive to limit the current in the diodes that protect the gate drive of the lower IGBT from a negative when the upper IGBT turns off has been modified by splitting the resistor in two and adapt the ratio between them to limit the effect of the total parasitic inductance on the dI/dt. The total resistor remains the same but the voltage divider gives the desired weight of the emitter inductance.

The overvoltage can be optimized to reach the maximum operating voltage; this is done by reducing the resistor connected to the logical emitters $R_2$ compared to the resistor connected to the power tab $R_3$. The voltage across the emitter inductance will be split in two and only the voltage across the logical resistor will be applied in the gate drive circuit to limit the gate voltage drop.

Figure 3:
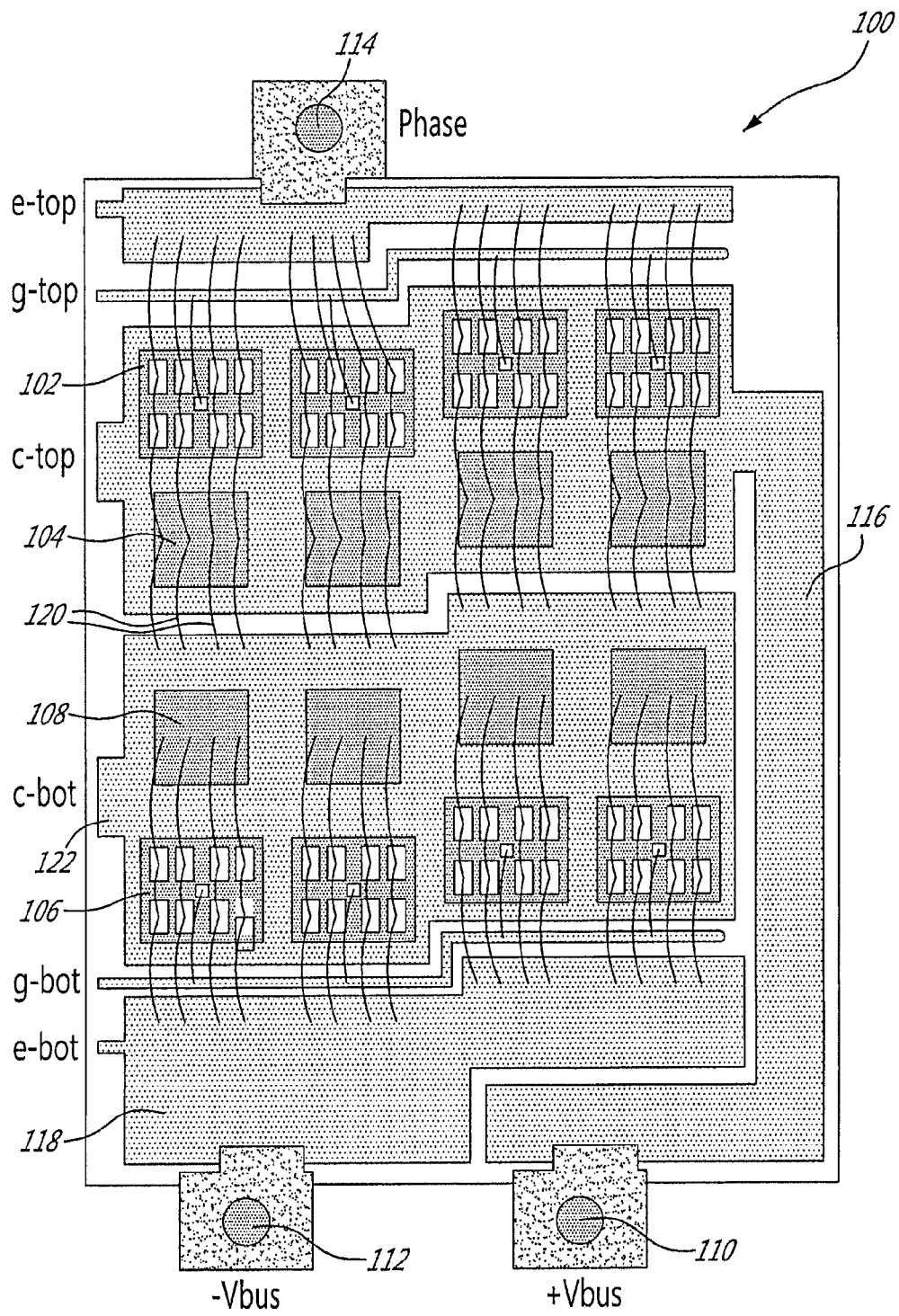
FIG. 3, which is labeled "Prior Art" illustrates a typical topology for an IGBT module.

FIG. 3 of the appended drawings schematically illustrates a conventional IGBT module topology 100 including a first set of parallelized IGBT 102 defining the top IGBT Q2 of FIG. 2 and their associated diodes 104; a second set of parallelized IGBT 106 defining the bottom IGBT Q1 of FIG. 2 and their associated diodes 108; a +Vbus tab 110, a −Vbus tab 112 and a Phase tab 114.

A can be seen from this figure, the interconnections creating parasitic inductances between the various elements are done via DBC traces, wire bonds and external connections.

The connection between the emitter of the bottom IGBT 106 and the external connection of −Vbus 112 contains a zigzag pattern thereby creating a parasitic inductance between these elements. Accordingly, the level of voltage across the emitter inductance of the bottom IGBT that is injected in the gate driver to create a negative voltage at the emitter of the bottom IGBT to slow down the negative slope of the gate voltage is adequate.

On the other hand, the wire bonds 120 interconnecting the emitter of the top IGBT 102 and the collector trace 122 of the bottom IGBT 106 are quite short. Indeed, because of the constraints on packaging of IGBT modules, the upper and lower IGBTs and diodes are often packaged in close proximity of each other. Therefore, the inductance between the emitter of the top IGBT and the collector of the bottom IGBT is quite small, in the order of a few nH. Accordingly, the level of voltage across the emitter inductance of the top IGBT that is injected in the gate driver to create a negative voltage at the emitter of the top IGBT to slow down the negative slope of the gate voltage is too small to limit the overvoltage at an appropriate level.

Figure 4:
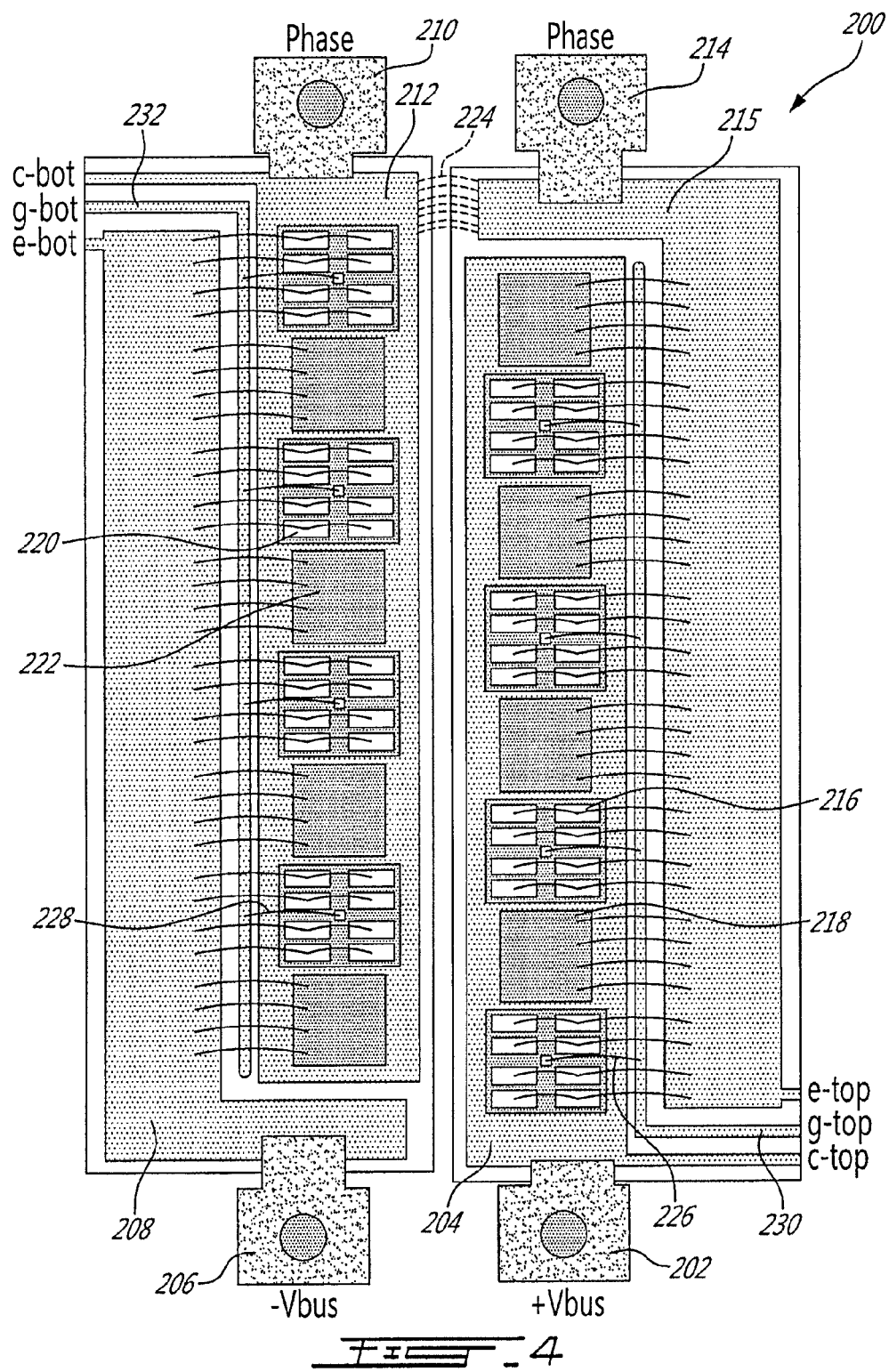
FIG. 4 illustrates a topology for an IGBT module according to a first illustrative embodiment.

FIG. 4 of the appended drawings illustrates an IGBT module topology 200 according to a first illustrative embodiment.

Generally stated, the module 200 includes a +Vbus tab 202 connected to the collector trace 204 of the top IGBT (C-top), a −Vbus tab 206 connected to the emitter trace 208 of the bottom IGBT (E-bot), a first phase tab 210 connected to the collector trace 212 of the bottom IGBT (C-bot) and a second phase tab 214 connected to the emitter trace 215 of the top IGBT (E-top). The module 200 also includes a first set of parallelized IGBT 216 defining the top IGBT Q2 of FIG. 2 and their associated diodes 218; a second set of parallelized IGBT 220 defining the bottom IGBT Q1 of FIG. 2 and their associated diodes 222.

The base of the upper IGBT dies 216 are directly connected to the C-top 204 while the base of the lower IGBT dies 220 are directly connected to the C-bot 212. Wire bonds are used to connect the emitter of the IGBTs 216 and 220 to their respective emitter traces 215 and 208. Wire bonds 226 and 228 are used to connect the gate of the IGBTs 216 and 220 to their respective g-top and g-bot gate traces 230 and 232.

Accordingly, the interconnection between C-bot and E-top can be made using wire bonds 224 (shown in dashed lines) or by the interconnection of the first and second phase tabs 210 and 214 directly or using a predetermined length of wire (not shown) to increase the parasitic inductance between these two elements, i.e. the parasitic inductance of the emitter of the top IGBT to operate at a higher level. Therefore, the level of voltage across the emitter inductance of the top IGBT that is injected in the gate driver to create a negative voltage at the emitter of the top IGBT to slow down the negative slope of the gate voltage is adequate.

Turning now to FIG. 5 of the appended drawings, an IGBT module topology 300 according to a second illustrative embodiment will be described. It is to be noted that while the first illustrative embodiment 200 of FIG. 4 is a 2D embodiment, the second illustrative embodiment of FIG. 5 is a 3D embodiment as will be understood by the following disclosure.

Similarly to the module 200 described hereinabove, the module 300 includes a +Vbus tab 302 connected to the collector trace 304 of the top IGBT (C-top), a −Vbus tab 306 connected to the emitter trace 308 of the bottom IGBT (E-bot), a first phase tab 310 connected to the collector trace 312 of the bottom IGBT (C-bot) and a second phase tab 314 connected to the emitter trace 315 of the top IGBT (E-top). The module 300 also includes a first set of parallelized IGBT 316 defining the top IGBT Q2 of FIG. 2 and their associated diodes 318; a second set of parallelized IGBT 320 defining the bottom IGBT Q1 of FIG. 2 and their associated diodes 322.

The base of the IGBT dies 316 are directly connected to the C-top trace 304 while the base of the IGBT dies 320 are directly connected to the C-bot trace 312. Solder balls 330 are provided on the top of the IGBTs and diodes. These balls are used to connect the emitter of the IGBTs 316 and 320, and their associated diodes 318 and 322 to their respective emitter traces 315 and 308. This is done by layering the E-top trace 315 and its associate substrate on top of the C-top trace 304 and by layering the E-bot trace 308 and its associate substrate on top of the C-bot trace 312. The resulting IGBT module topology therefore has a smaller footprint and a smaller overall parasitic inductance.

Accordingly, the interconnection between C-bot and E-top can be made using wire bond 332 (shown in dashed lines), using other interconnection means or by the interconnection of the first and second phase tabs 310 and 314 directly or using a predetermined length of wire (not shown) to increase the parasitic inductance between these two elements, i.e. the parasitic inductance of the emitter of the top IGBT. Therefore, the level of voltage across the emitter inductance of the top IGBT that is injected in the gate driver to create a negative voltage at the emitter of the top IGBT to slow down the negative slope of the gate-emitter voltage ($V_{ge}$) is adequate.

The IGBT module topology 400 illustrated in FIG. 6 of the appended drawings is similar to the IGBT module topology of FIG. 4 described hereinabove. The main difference is that the E-top trace 402 and its associated G-top trace 404 (the trace interconnecting the gate of the top IGBT to the outside world) are provided between the first and second sets of parallelized IGBT 406 and 408 instead of being external thereto as illustrated in FIG. 4. Keeping the Le-top at an adequate value, this packaging reduces the overall parasitic inductance to allow faster turn-OFF with the same overvoltage. The interconnection of the various elements of the module 400 is similar to the interconnection of the elements of the module 200 of FIG. 4.

It is interesting to keep low the total parasitic inductance in the high frequency loop. Ideally, this may be accomplished by reducing Lc-top (trace 116 in FIG. 3, for example) and increasing Le-top (the length of the interconnection between tabs 210 and 214 in FIG. 4, for example).

One skilled in the art will understand that the appended figures are schematic and that other elements are required in the topologies described hereinabove. For example, some connections are required on some of the traces to allow signals to be retrieved and fed back and to interconnect the gate driver and other resistors as shown on FIG. 2.

One skilled in the art will also understand that while modules including a plurality of parallelized controlled power switches are illustrated and described herein, modules including single controlled power switches would also benefit from the above teachings.

It is to be understood that the topology for controlled power switch module is not limited in its application to the details of construction and parts illustrated in the accompanying drawings and described hereinabove. The proposed topology for controlled power switch module is capable of other embodiments and of being practiced in various ways. It is also to be understood that the phraseology or terminology used herein is for the purpose of description and not limitation. Hence, although the topology for controlled power switch module has been described hereinabove by way of illustrative embodiments thereof, it can be modified, without departing from the spirit, scope and nature of the subject invention.

What is claimed is:

1. A power switch module, comprising:
   a top power switch including a gate, a collector and an emitter, the top power switch configured to be controlled by a top gate driver circuit;
   a bottom power switch including a gate, a collector and an emitter, the bottom power switch configured to be controlled by a bottom gate driver circuit;
   a top collector trace connected to the collector of the top power switch;
   a bottom collector trace connected to the collector of the bottom power switch;
   a top emitter trace connected to the emitter of the top power switch;
   a bottom emitter trace connected to the emitter of the bottom power switch;
   a −Vbus tab connected to the bottom emitter trace;
   a +Vbus tab connected to the top collector trace;
   at least one phase tab connected to either the bottom collector trace and the top emitter trace; and
   an interconnection of the top emitter trace to the bottom collector trace defining a parasitic emitter inductance having such a value that a voltage generated thereacross, during dI/dt, is injected in the top gate driver circuit to create a positive voltage at the emitter of the top power switch to slow down a slope of a gate-emitter voltage (Vge) at turn on.

2. The power switch module of claim 1, wherein the top power switch includes at least two parallelized power switches.

3. The power switch module of claim 1, wherein the bottom power switch includes at least two parallelized power switches.

4. The power switch module of claim 1, wherein the at least one phase tab includes a first phase tab connected to the top emitter trace and a second phase tab connected to the bottom collector trace.

5. The power switch module of claim 4, wherein the top emitter trace and the bottom collector trace are interconnected via an external interconnection of the first and second phase tabs.

6. The power switch module of claim 1, wherein the top emitter trace and the bottom collector trace are interconnected via wire bonds.

7. The power switch module of claim 2, wherein the top emitter trace interconnects the emitters of the parallelized top power switches via a plurality of solder balls mounted to the emitters of the parallelized top power switches onto which the top emitter trace is layered.

8. The power switch module of claim 3, wherein the bottom emitter trace interconnects the emitters of the parallelized bottom power switches via a plurality of solder balls mounted to the emitters of the parallelized bottom power switches onto which the bottom emitter trace is layered.

9. The power switch module of claim 7, wherein a) the bottom power switch includes at least two parallelized power switches and b) the bottom emitter trace interconnects the emitters of the parallelized bottom power switches via a plurality of solder balls mounted to the emitters of the parallelized bottom power switches onto which the bottom emitter trace is layered.

10. The power switch module of claim 9, wherein the at least one phase tab includes a first phase tab connected to the top emitter trace and a second phase tab connected to the bottom collector trace.

11. The power switch module of claim 10, wherein the top emitter trace and the bottom collector trace are interconnected via an external interconnection of the first and second phase tabs.

12. The power switch module of claim 9, wherein the top emitter trace and the bottom collector trace are interconnected via wire bonds.

13. A DC to AC inverter, comprising:
   a power switch module including;
      a top power switch including a gate, a collector and an emitter, the top power switch configured to be controlled by a top gate driver circuit;
      a bottom power switch including a gate, a collector and an emitter, the bottom power switch configured to be controlled by a bottom gate driver circuit;
      a top collector trace connected to the collector of the top power switch;
      a bottom collector trace connected to the collector of the bottom power switch;
      a top emitter trace connected to the emitter of the top power switch;
      a bottom emitter trace connected to the emitter of the bottom power switch;

a −Vbus tab connected to the bottom emitter trace;
a +Vbus tab connected to the top collector trace;
at least one phase tab connected to either the bottom collector trace and the top emitter trace; and
an interconnection of the top emitter trace to the bottom collector trace defining a parasitic emitter inductance having such a value that a voltage generated thereacross, during dI/dt, is injected in the top gate driver circuit to create a positive voltage at the emitter of the top power switch to slow down a slope of a gate-emitter voltage (Vge) at turn on.

14. A three-phase inverter, comprising:
three power switch modules, each of the modules including:
- a top power switch including a gate, a collector and an emitter, the top power switch configured to be controlled by a top gate driver circuit;
- a bottom power switch including a gate, a collector and an emitter, the bottom power switch configured to be controlled by a bottom gate driver circuit;
- a top collector trace connected to the collector of the top power switch;
- a bottom collector trace connected to the collector of the bottom power switch;
- a top emitter trace connected to the emitter of the top power switch;
- a bottom emitter trace connected to the emitter of the bottom power switch;
- a −Vbus tab connected to the bottom emitter trace;
- a +Vbus tab connected to the top collector trace;
- at least one phase tab connected to either the bottom collector trace and the top emitter trace; and
- an interconnection of the top emitter trace to the bottom collector trace defining a parasitic emitter inductance having such a value that a voltage generated thereacross, during dI/dt, is injected in the top gate driver circuit to create a positive voltage at the emitter of the top power switch to slow down a slope of a gate-emitter voltage (Vge) at turn on.

\* \* \* \* \*